United States Patent
Lin et al.

(10) Patent No.: US 10,268,791 B2
(45) Date of Patent: Apr. 23, 2019

(54) SYSTEM AND METHOD FOR MULTI-PATTERNING

(71) Applicant: TAIWAN SEMICONDUCTOR MANUFACTURING CO., LTD., Hsinchu (TW)

(72) Inventors: Yen-Hung Lin, Hsinchu (TW); Chung-Hsing Wang, Hsinchu County (TW); Chin-Chou Liu, Hsinchu County (TW); Chi-Wei Hu, Taoyuan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 524 days.

(21) Appl. No.: 14/967,061

(22) Filed: Dec. 11, 2015

(65) Prior Publication Data
US 2017/0169154 A1 Jun. 15, 2017

(51) Int. Cl.
*G06F 17/50* (2006.01)

(52) U.S. Cl.
CPC ........ *G06F 17/5068* (2013.01); *G06F 17/509* (2013.01); *G06F 17/5081* (2013.01)

(58) Field of Classification Search
CPC . G06F 17/5068; G06F 17/509; G06F 17/5081
USPC .......................................................... 716/55
See application file for complete search history.

(56) References Cited

U.S. PATENT DOCUMENTS

| 8,689,151 | B1 * | 4/2014 | Agarwal | G03F 7/70466 716/50 |
| 2011/0197168 | A1 * | 8/2011 | Chen | G06F 17/5081 716/50 |
| 2014/0282293 | A1 * | 9/2014 | Lin | G06F 17/5081 716/52 |

* cited by examiner

*Primary Examiner* — Jack Chiang
*Assistant Examiner* — Brandon Bowers
(74) *Attorney, Agent, or Firm* — Maschoff Brennan

(57) ABSTRACT

A method is disclosed that includes the operation below. Vertices in a conflict graph are sorted into a first clique and a second clique, in which the conflict graph corresponds to a layout of a circuit. A first vertex of the vertices is merged with a second vertex of the vertices, to generate a reduced graph, in which the first clique excludes the second vertex, and the second clique excludes the first vertex. A first color pattern of a plurality of color patterns is assigned to a first pattern, corresponding to the first vertex, and a second pattern, corresponding to the second vertex, in the layout according to the reduced graph.

20 Claims, 7 Drawing Sheets

US 10,268,791 B2

SYSTEM AND METHOD FOR MULTI-PATTERNING

BACKGROUND

Multiple exposure or multi-patterning technology (MPT) involves forming patterns on a single layer of a substrate using two or more different masks in succession. If only two masks are used for patterning a layer, the technique is referred to as double exposure. One form of double exposure is referred to as double patterning technology (DPT). In DPT, first and second masks are used sequentially to pattern the same layer. As long as the patterns within each mask comply with the relevant minimum separation distances for the technology node, the combination of patterns formed using both masks may include smaller separations than the minimum separation distance. MPT allows line segments, and in some cases, more complex shapes to be formed of a vertical segment and a horizontal segment on the same mask. Thus, MPT provides flexibility and generally allows for significant reduction in overall IC layout.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
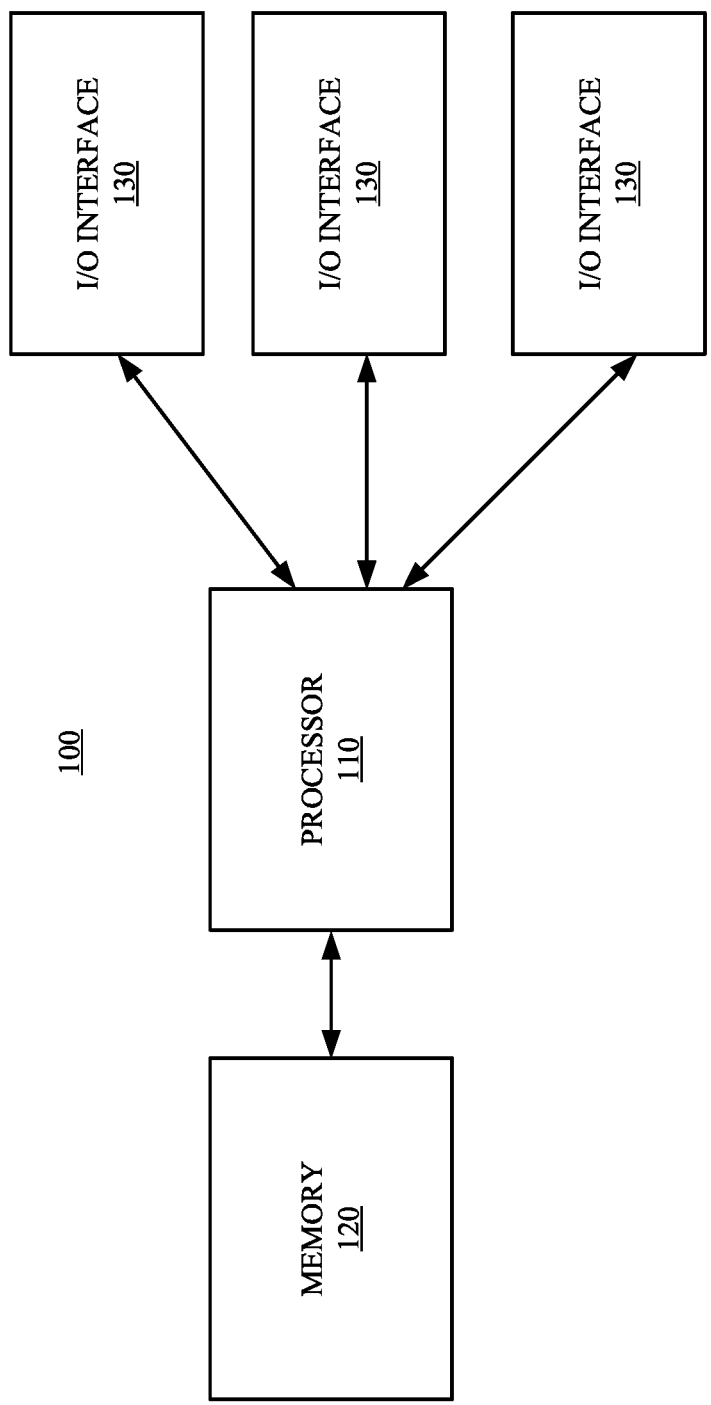
FIG. 1 is a schematic diagram of a design system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In order to facilitate the illustration of various embodiments of the present disclosure, various terms or components regarding fabrications of semiconductor devices are introduced herein. In some embodiments, integrated circuits (IC) are fabricated by photolithographic techniques, including, for example, forming conductive lines and shapes. For example, copper lines in an interconnect layer of an IC are formed by photolithographic techniques, or a diffusion region in an active device layer of the IC is formed by the photolithographic techniques. These conductive lines and shapes are generally referred to as patterns or polygons in a layout of the IC. Using photolithography to form these patterns is also referred to as "patterning." Methods in which a single layer of an IC is exposed with two or more photomasks are referred to as multi-patterning.

For ease of visualization, patterns assigned to respectively different masks used to expose the same layer are often drawn in respectively different color patterns. Thus, the set of patterns, which are assigned to be exposed in the photoresist using a given mask, is referred to as being assigned the same "color pattern." In some embodiments, a display device is configured to display the layout of the IC, in which all circuit patterns assigned to a single photomask using the same color pattern.

In some cases, a proposed division of the patterns among three different masks results in one mask having two patterns closer to each other than a minimum separation distance, a situation referred to as a conflict. Some conflicts are able to be solved by re-assigning a pattern to a different photomask. If, however, there is no way to divide the patterns of that layer among three different masks without having two patterns in a single mask closer to each other than the minimum separation distance, there is a patterning conflict. Some conflicts are able to be resolved by a design (layout) change, or an advanced technique, including, for example, splitting a single circuit pattern into two abutting parts, each to be patterned by a respective mask, and stitched together.

FIG. 1 is a schematic diagram of a design system 100, in accordance with some embodiments of the present disclosure.

As illustratively shown in FIG. 1, the design system 100 includes a processor 110, a memory 120, and Input/Output (I/O) interfaces 130. The processor 110 is coupled to the memory 120 and the I/O interfaces 130. In various embodiments, the processor 110 is a central processing unit (CPU), an application specific integrated circuit (ASIC), a multi-processor, a distributed processing system, or a suitable processing unit. Various circuits or units to implement the processor 110 are within the contemplated scope of the present disclosure.

The memory 120 is configured to store one or more program codes for aiding design of integrating circuits. For illustration, the memory 120 stores a program code encoded with a set of instructions for reducing a graph for the multi-patterning. The processor 110 is able to execute the program codes stored in the memory 120, and the operations of reducing the graph are able to be automatically performed.

In some embodiments, the memory 120 is a non-transitory computer readable storage medium encoded with, i.e., storing, a set of executable instructions for reducing the graph for the multi-patterning. For illustration, the memory 120 stores executable instructions for performing operations including, for example, operations S310-S370 illustrated in FIG. 3. In some embodiments, the computer readable storage medium is an electronic, magnetic, optical, electromagnetic, infrared, and/or a semiconductor system (or apparatus or device). For example, the computer readable storage medium includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer readable storage medium includes a compact disk-read only memory (CD-ROM), a compact disk-read/write (CD-R/W), and/or a digital video disc (DVD).

The I/O interfaces 130 receive data or commands from various control devices which, for example, are operated by a circuit designer and/or a layout designer. Accordingly, the design system 100 is able to be manipulated with the inputs or commands received by the I/O interfaces 130. In some embodiments, the I/O interfaces 130 include a display device configured to display the status of executing the program code. In some further embodiments, the display device is configured to display patterns in a layout, and/or color patterns assignments in the patterns. In some embodiments, the I/O interfaces 130 include a graphical user interface (GUI). In some other embodiments, the I/O interfaces 130 include a keyboard, keypad, mouse, trackball, track-pad, touch screen, cursor direction keys, or the combination thereof, for communicating information and commands to processor 110.

Figure 2A:
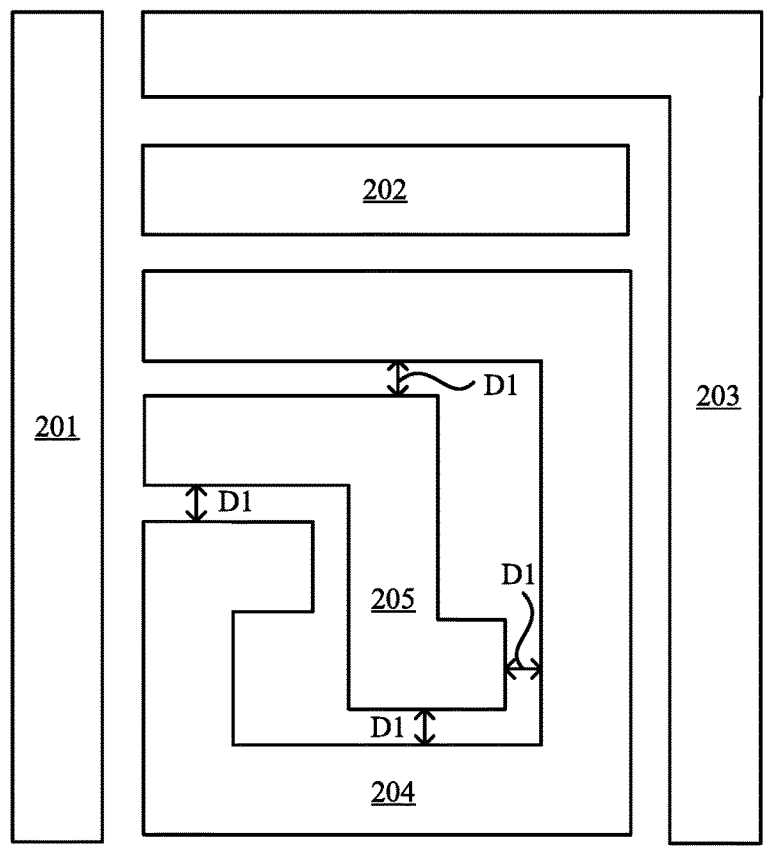
FIG. 2A is a schematic diagram of a layout of a circuit, in accordance with some embodiments of the present disclosure.

FIG. 2A is a schematic diagram of a layout 200 of a circuit, in accordance with some embodiments of the present disclosure. In some embodiments, the layout 200 is generated by receiving data, storing the layout of a circuit, from the I/O interfaces 130 in FIG. 1. In some other embodiments, the layout 200 is generated by an electronic design automation (EDA) tool carried in the memory 120 in FIG. 1.

The implementations of the layout 200 are given for illustrative purposes. Various implementations of the layout 200 are within the contemplated scope of the present disclosure. In order to facilitate the illustration of a graph reduction method 300 of FIG. 3, various terms or components regarding layout and patterns thereof are introduced with reference to FIG. 2A.

As illustratively shown in FIG. 2A, in some embodiments, the layout 200 includes five patterns 201-205. The patterns 201-205 are shown in a form of a polygon that is able to define a circuit pattern in an IC. In some cases, quadruple patterning lithography is employed. In other words, only four masks are employed to form the five patterns 201-205 in the layout 200 during the multi-patterning. In some embodiments, for ease of visualization, the processor 110 in FIG. 1 assigns four colors patterns, corresponding to the four masks, to the patterns 201-205. In other words, two of the patterns 201-205 would be assigned to the same color patterns. In some situations, a conflict would be presented in the layout 200 when the patterns 204 and 205 are assigned to have the same color pattern. For example, a minimum separation distance between the adjacent patterns is determined from the design rules and technology file for the process being used. The minimum separation distance is set to ensure that the adjacent patterns are able to be clearly formed by a single photomask. If the patterns 204 and 205 are assigned to have the same color pattern, the distances D1 between the patterns 204 and 205 are expected to be greater than or equal to the minimum separation distance, in order to meet the requirements of the design rules. Accordingly, when the patterns 204 and 205 are assigned to have the same color pattern, the conflict is detected by the processor 110 in FIG. 1.

Figure 2B:
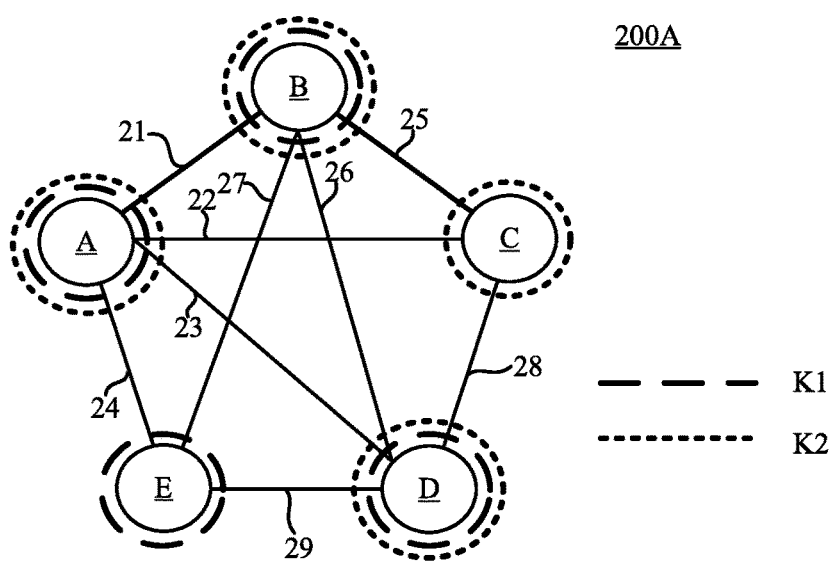
FIG. 2B is a conflict graph corresponding to the layout in FIG. 2A in accordance with some embodiments of the present disclosure.

Reference is now made to both of FIG. 2A and FIG. 2B. FIG. 2B is a conflict graph 200A corresponding to the layout 200 in FIG. 2A in accordance with some embodiments of the present disclosure.

In some embodiments, a designer is able to input data representing the conflict graph 200A to the design system 100 in FIG. 1 via the I/O interfaces 130 in FIG. 1. Accordingly, at least one of the EDA tool carried in the memory 120 in FIG. 1 is activated to perform the operations of graph-reducing according to the conflict graph 200A. In some other embodiments, the processor 110 in FIG. 1 is configured to generate the conflict graph 200A according to data representing the layout 200 in FIG. 2A. The implementations of the conflict graph 200A are given for illustrative purposes. Various implementations of the conflict graph 200A are within the contemplated scope of the present disclosure. In order to facilitate the illustration of the graph reduction method 300 of FIG. 3, various terms or components regarding the conflict graph are introduced with reference to FIG. 2B.

In some embodiments, the conflict graph 200A is utilized to show the spacing relation among the patterns 201-205. For illustration of FIG. 2B, the conflict graph 200A includes vertices A, B, C, D, and E, and edges 21-29. The vertices A, B, C, D, and E correspond to the patterns 201-205 in FIG. 2A. The edges 21-29 correspond to the spacing between the vertices A, B, C, D, and E. For example, the vertex A is connected with the vertices B, C, D, and E via the edges 21, 22, 23, and 24, respectively. The rest connections among the vertices B, C, D, and E are similar with the connection of the vertex A. Thus, the repetitious descriptions are not given here.

In some embodiments, the design system 100 is able to generate a reduced graph, which is, for example, the reduced graph 400 shown in FIG. 4 below, according to the conflict graph 200A. In some embodiments, the design system 100 is configured to assign the color patterns to the patterns in the layout 200 in FIG. 2A according to the reduced graph. In some alternative embodiments, the design system 100 is configured to detect whether a conflict, which violates certain design rules, is presented in the reduced graph.

The following paragraphs describe certain embodiments related to the design system 100 to illustrate functions and applications thereof. However, the present disclosure is not limited to the following embodiments. Various arrangements are able to implement the functions and the operations of the design system 100 in FIG. 1 are within the contemplated scope of the present disclosure.

Figure 3:
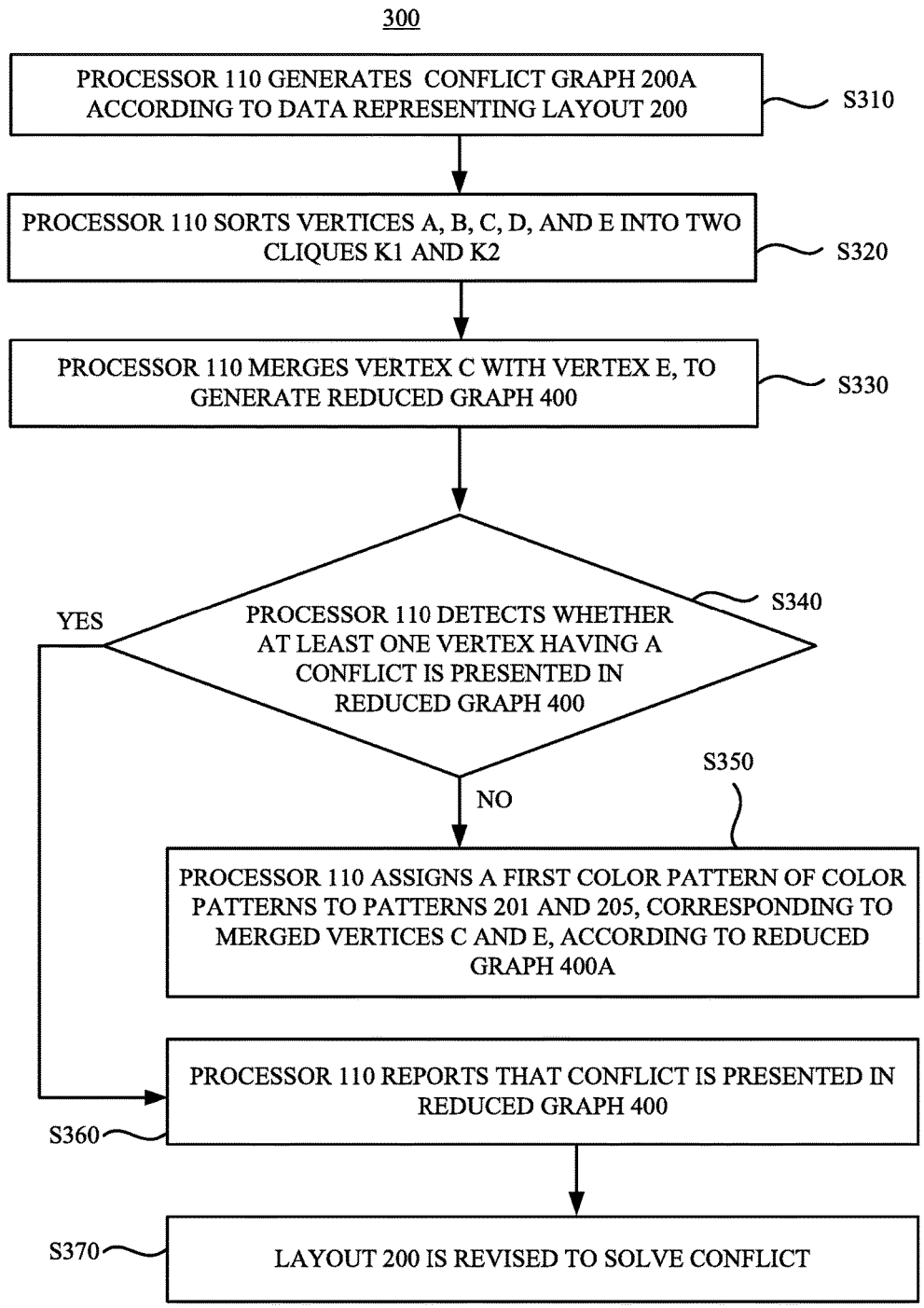
FIG. 3 is a flow chart of a method, in accordance with some embodiments of the present disclosure.

FIG. 3 is a flow chart of a method 300, in accordance with some embodiments of the present disclosure. For ease of understanding, reference is now made to FIGS. 1-3, and the operations of the method 300 are described with the design system 100 in FIG. 1. In some embodiments, the method 300 includes operations S310-S370.

In operation S310, the processor 110 in FIG. 1 generates the conflict graph 200A in FIG. 2B according to data representing the layout 200 in FIG. 2A. In some embodiments, at least one EDA tool carried in the memory 120 in FIG. 1 is activated by the processor 110, to decompose the layout 200 in FIG. 2A to generate the conflict graph 200A. Alternatively, in some other embodiments, the processor 110 is able to receive data representing the conflict graph 200A via the I/O interfaces 130 in FIG. 1.

In operation S320, the processor 110 sorts the vertices A, B, C, D, and E into two cliques K1 and K2. In operation S330, the processor 110 merges the vertex C with the vertex E, to generate a reduced graph 400 in FIG. 4. The operations S320 and S330 are described with reference to FIG. 4 below.

Figure 4:
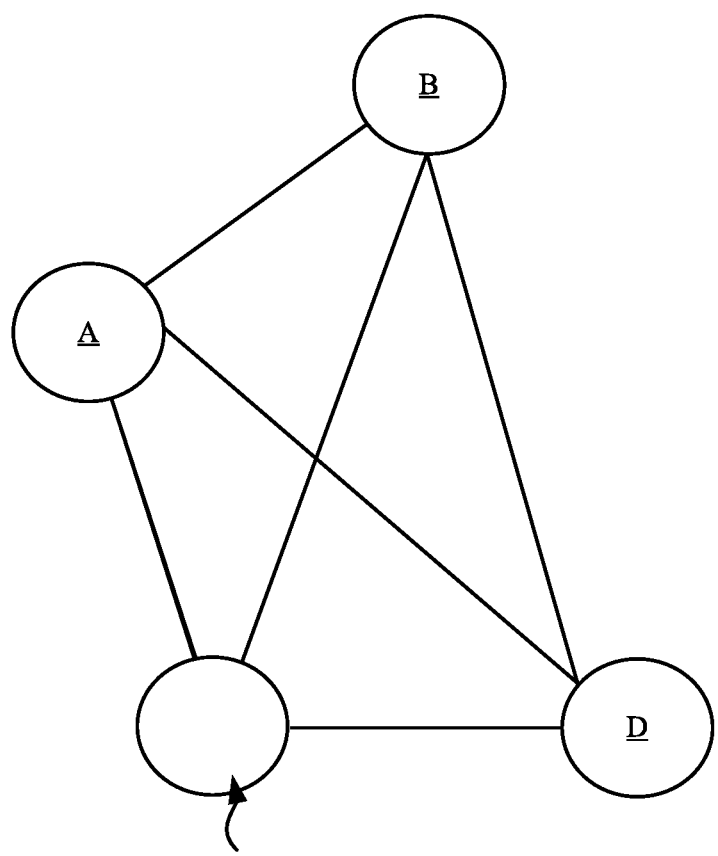
FIG. 4 is a reduced graph generated according to the conflict graph in FIG. 2B, in accordance with some embodiments of the present disclosure.

FIG. 4 is a reduced graph 400 generated according to the conflict graph 200A in FIG. 2B, in accordance with some embodiments of the present disclosure. With respect to the embodiments of FIG. 2B, like elements in FIG. 4 are designated with the same reference numbers for ease of understanding.

Reference is now made to both of FIG. 2B and FIG. 4. In some embodiments, M color patterns are employed to be assigned to the patterns in the layout 200A, in which M is a positive integer. In some embodiments, the clique K1 and the clique K2 are configured to have M−1 common vertices. In some further embodiments, M is greater than or equal to 4. For illustration, as described above, quadruple patterning lithography is employed. In other words, M is equal to four. Thus, as illustrated in FIG. 2B, four vertices A, B, D, and E are sorted into the clique K1. The four vertices A, B, D, and E in the clique K1 are connected with each other. The four vertices of A, B, C, and D are sorted into the clique K2. The four vertices A, B, C, and D in the clique K2 are connected with each other. The clique K1 and the clique K2 have three common vertices A, B, and D. In other words, the vertex E in the clique K1 is independent of the clique K2, and the vertex C in the clique K2 is independent of the clique K1. Accordingly, the vertices C and E are able to be merged to generate the reduced graph 400 illustrated in FIG. 4.

With continued reference to FIG. 3, in operation S340, the processor 110 detects whether at least one vertex having a conflict is presented in the reduced graph 400. If there is no vertex having the conflict in the reduced graph 200A, operation S350 is performed. Otherwise, operation S360 is performed.

In operation S350, the processor 110 assigns a first color pattern of the color patterns to the patterns 201 and 205, corresponding to the merged vertices C and E, according to the reduced graph 400A.

For illustration, as describe above, quadruple patterning lithography is employed. A first color pattern of the four color patterns is able to be assigned to the pattern 203 in FIG. 2A, corresponding to the vertex C, and the pattern 205 in FIG. 2A corresponding to the vertex E. The rest color patterns of the four color patterns are assigned to patterns 201, 202, and 204 in FIG. 2A, corresponding to the vertices A, B, and D, respectively. Explained in a different way, the vertex E is a relative component of the clique K1 in the clique K2, which indicates that the clique K2 excludes the vertex E. The vertex C is a relative component of the clique K2 in the clique K1, which indicates that the clique K1 excludes the vertex C. Effectively, after the cliques K1-K2 are sorted, two disjoint vertices C and E are determined to be merged as one vertex, in order to reduce the complexity of the conflict graph 200A in FIG. 2B. Since only four color patterns are employed, three color patterns thereof are assigned to patterns 201, 202, and 204, which correspond to the three common vertices A, B, and D, respectively. Accordingly, the last color pattern is thus assigned to the patterns 203 and 205 corresponding to the merged vertices C and E.

With continued reference to FIG. 3, in operation S360, the processor 110 reports that the conflict is presented in the reduced graph 400. In operation S370, the layout 200 is revised to solve the conflict. The operations S340, S360, and S370 are illustrated with reference to FIG. 5A and FIG. 5B below. After operation S370 is performed, the layout 200 is determined. In some embodiments, the system 100 is further configured to transmit a file storing the determined layout 200 to certain tools, in order to fabricate a semiconductor device or an IC that includes a circuit corresponding to the determined layout 200. In some other embodiments, the system 100 is further configured to control certain tools to fabricate a semiconductor device or an IC that includes a circuit corresponding to the determined layout 200.

Figure 5A:
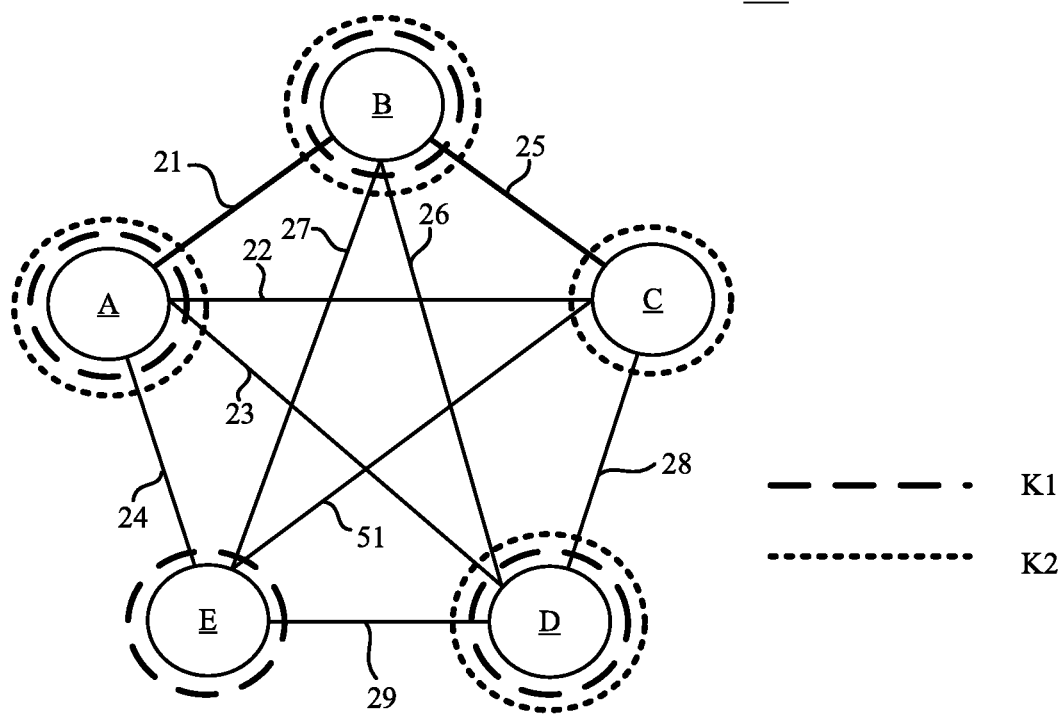
FIG. 5A is a schematic diagram of a conflict graph corresponding to a layout of a circuit, in accordance with some other embodiments of the present disclosure.
Figure 5B:
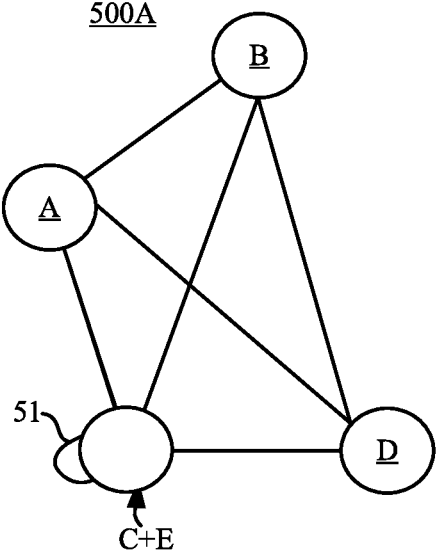
FIG. 5B is a schematic diagram of a reduced graph generated according to the conflict graph in FIG. 5A, in accordance with some other embodiments of the present disclosure.

Reference is now made to FIG. 5A and FIG. 5B. FIG. 5A is a schematic diagram of a conflict graph 500 corresponding to a layout of a circuit, in accordance with some other embodiments of the present disclosure. FIG. 5B is a schematic diagram of a reduced graph 500A generated according to the conflict graph in FIG. 5A, in accordance with some other embodiments of the present disclosure. With respect to the embodiments of FIG. 2B, and FIG. 3, like elements in FIGS. 5A-5B are designated with the same reference numbers for ease of understanding.

As illustratively shown in FIG. 5A, the conflict graph 500 includes vertices A, B, C, D, and E, in which the vertices A, B, D, and E are sorted in the clique K1, and the vertices A, B, C, and D are sorted in the clique K2. Accordingly, two disjoint vertices C and E are determined to be merged, to generate the reduced graph 500A in FIG. 5B. In some embodiments, the processor 110 in FIG. 1 is configured to detect whether a self-connected vertex is presented in the reduced graph 500A, in order to detect the conflict.

For illustration of FIG. 5A, compared with the two disjoint vertices C and E in FIG. 2B, the vertices C and E in the FIG. 5A are connected with each other via an edge 51. Effectively, the merged vertices C and E in the reduced graph 500A in FIG. 5B are self-connected via the edge 51. Thus, if the same color pattern was assigned to the patterns, corresponding to the merged vertices C and E in the reduced graph 500A in FIG. 5B, in the layout, the spacing between the aforementioned patterns is not satisfied with the design rules. Effectively, the conflict is presented in the merged vertices C and E in FIG. 5B. The processor 110 then reports that the conflict is found in the reduced graph 500 to a designer via the I/O interfaces 130 in FIG. 1. In some embodiments, the report of the conflict detection is displayed by the display device in the I/O interfaces 130 in FIG. 1. As a result, the designer is notified to revise the layout of the circuit to solve the conflict. For example, the spacing and/or the position between the patterns of the patterns, corresponding to the two merged vertices C and E, is increased or changed via the I/O interfaces 130 in FIG. 1 and the EDA tools in the design system 100 in FIG. 1.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

In some alternative embodiments, the method 300 is implemented as a design tool carried on a non-transitory computer-readable medium. In other words, the method 300 is able to be implemented in hardware, software, firmware, and the combination thereof. For illustration, if speed and accuracy are determined to be paramount, a mainly hardware and/or firmware vehicle is selected and utilized. Alternatively, if flexibility is paramount, a mainly software implementation is selected and utilized.

As described above, with the operations of the method 300, the complexity of the conflict graph corresponding to the layout of a circuit is able to be reduced. As a result, the operations of color patterns assignments and/or the operations of detecting the conflicts in the multi-patterning in further applications are able to be performed more efficiently.

For ease of understanding, the embodiments above are described with quadruple patterning lithography. In various embodiments, four or more color patterns, that are able to be employed with the method 300 in FIG. 3, are within the contemplated scope of the present disclosure.

Figure 6A:
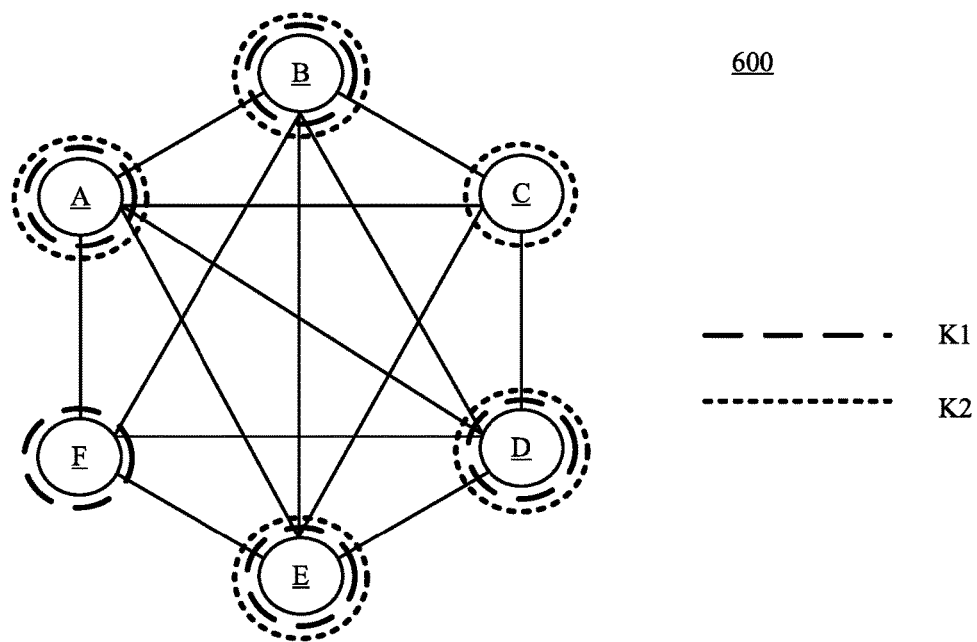
FIG. 6A is a schematic diagram of a conflict graph corresponding to a layout of a circuit, in accordance with some other embodiments of the present disclosure.
Figure 6B:
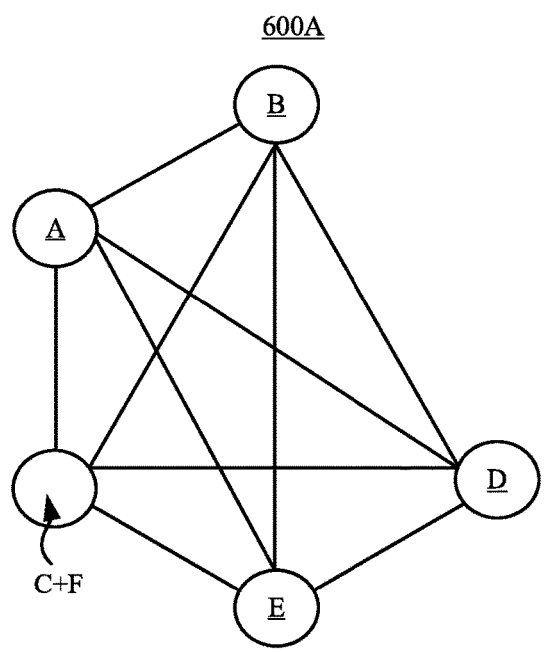
FIG. 6B is a schematic diagram of a reduced graph generated according to the conflict graph in FIG. 6A, in accordance with some other embodiments of the present disclosure.

Reference is now made to FIG. 6A and FIG. 6B. FIG. 6A is a schematic diagram of a conflict graph 600 corresponding to a layout of a circuit, in accordance with some other embodiments of the present disclosure. FIG. 6B is a schematic diagram of a reduced graph 600A generated according to the conflict graph 600 in FIG. 6A, in accordance with some other embodiments of the present disclosure. With respect to the embodiments of FIG. 2B, and FIG. 3, like elements in FIGS. 6A-6B are designated with the same reference numbers for ease of understanding.

For illustration, in the embodiments of FIGS. 6A-6B, five colors patterning lithography is employed. In other words, in the embodiments of FIGS. 6A-6B, M is equal to 5. As illustratively shown in FIG. 6A, the conflict graph 600 includes vertices A, B, C, D, E, and F. The vertices A, B, D, E, and F are sorted into the clique K1, in which the vertices A, B, D, E, and F are connected with each other. The vertices A, B, C, D, and E are sorted into the clique K2, in which the vertices A, B, C, D, and E are connected with each other. The cliques K1-K2 have four common vertices A, B, D, and E. Accordingly, the two disjoint vertices C and F are merged to generate the reduced graph 600A illustrated in FIG. 6B. Since there is no self-connected vertex presented in the reduced graph 600A, the processor 110 in FIG. 1 assigns a first color pattern of the five color patterns to the patterns, corresponding to the two disjoint vertices C and F, in the layout. The processor 110 then assigns the rest color patterns to the patterns, corresponding to the common vertices A, B, D, and F, respectively.

Figure 7A:
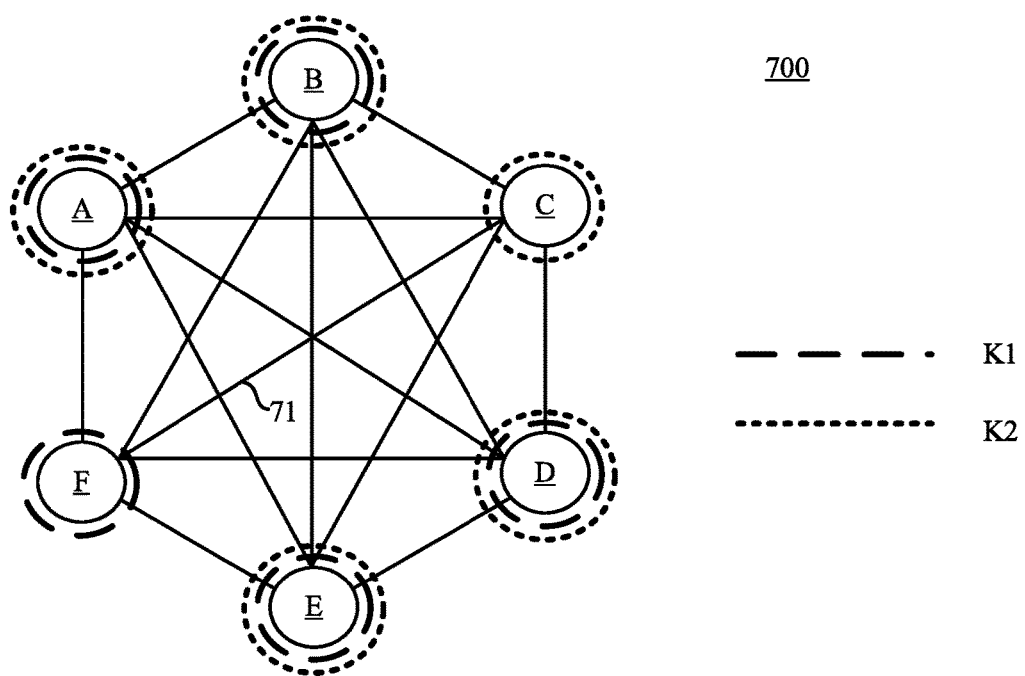
FIG. 7A is a schematic diagram of a conflict graph corresponding to a layout of a circuit, in accordance with some other embodiments of the present disclosure.
Figure 7B:
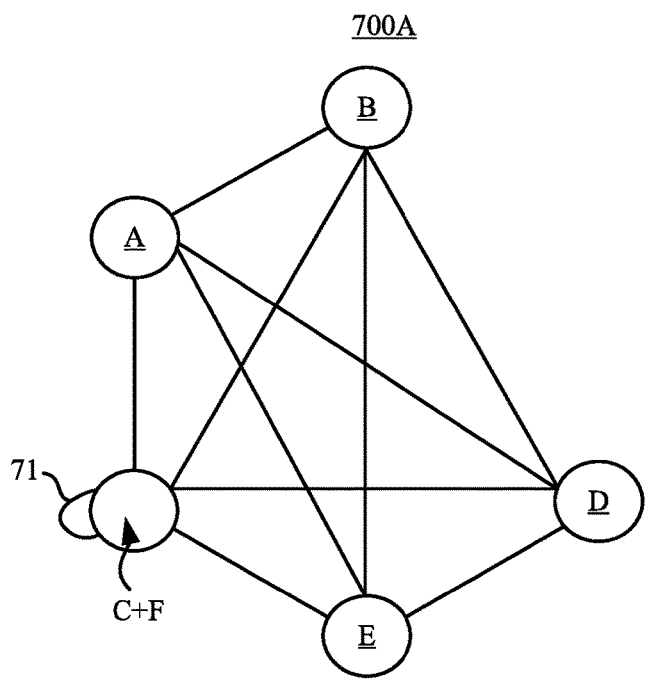
FIG. 7B is a schematic diagram of a reduced graph generated according to the conflict graph in FIG. 6A, in accordance with some other embodiments of the present disclosure.

Reference is now made to FIG. 7A and FIG. 7B. FIG. 7A is a schematic diagram of a conflict graph 700 corresponding to a layout of a circuit, in accordance with some other embodiments of the present disclosure. FIG. 7B is a schematic diagram of a reduced graph 700A 7B is a schematic diagram of a reduced graph 700A generated according to the conflict graph in FIG. 7A, in accordance with some other embodiments of the present disclosure. With respect to the embodiments of FIG. 2B, like elements in FIGS. 7A-7B are designated with the same reference numbers for ease of understanding.

For illustration, in the embodiments of FIGS. 7A-7B, five colors patterning lithography is utilized. In other words, in the embodiments of FIGS. 7A-7B, M is equal to 5. As illustratively shown in FIG. 7A, the conflict graph 700 includes vertices A, B, C, D, E, and F. The vertices A, B, D, E, and F are sorted into the clique K1, in which the vertices A, B, D, E, and F are connected with each other. The vertices A, B, C, D, and E are sorted into the clique K2, in which the vertices A, B, C, D, and E are connected with each other. The cliques K1-K2 have four common vertices A, B, E, and F. Accordingly, the two disjoint vertices C and F are merged to generate the reduced graph 700A illustrated in FIG. 7B.

Compared with the conflict graph 600 in FIG. 6A, the vertices C and F in the conflict graph 700 in FIG. 7A are further connected with each other via an edge 71. Accordingly, the processor 110 in FIG. 1 detects that the merged vertices C and F in the reduced graph 700A are self-connected. The processor 110 then reports that the conflict is found in the reduced graph 700 to a designer via the I/O interfaces 130. As a result, the layout of the circuit is revised to meet the requirements of the design rules.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a method is disclosed that includes the operation below. Vertices in a conflict graph are sorted into a first clique and a second clique, in which the conflict graph corresponds to a layout of a circuit. A first vertex of the vertices is merged with a second vertex of the vertices, to generate a reduced graph, in which the first clique excludes the second vertex, and the second clique excludes the first vertex. A first color pattern of a plurality of color patterns is assigned to a first pattern, corresponding to the first vertex, and a second pattern, corresponding to the second vertex, in the layout according to the reduced graph.

Also disclosed is a system that includes a memory configured to store computer program codes, and a processor. The memory is configured to store computer program codes. The processor is configured to execute the computer codes in the memory to perform operations below. A first vertex in a first clique of vertices in a conflict graph is merged with a second vertex in a second clique of vertices in the conflict graph, to generate a reduced graph, in which the first vertex is independent of the second clique, the second vertex is independent of the first clique, and the conflict graph corresponds to a layout of a circuit. A first color pattern of color patterns is assigned to a first pattern, corresponding to the first vertex, and a second pattern, corresponding to the second vertex, in the layout according to the reduced graph.

Also disclosed is a non-transitory computer readable medium that includes computer executable instructions which, when executed by a processor, cause the processor for carrying out a method. The method includes the operation below. A first vertex of vertices in a conflict graph is merged with a second vertex of the vertices, to generate a reduced graph, in which the conflict graph corresponds to a layout a circuit. A first color pattern of color patterns is assigned to a first pattern, corresponding to the first vertex, and a second pattern, corresponding to the second vertex, in the layout when the first vertex is not connected to the second vertex.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    sorting a plurality of vertices in a conflict graph into a first clique and a second clique, wherein the conflict graph corresponds to a layout of a circuit;
    merging a first vertex of the vertices with a second vertex of the vertices, to generate a reduced graph, wherein the first clique excludes the second vertex, and the second clique excludes the first vertex;
    assigning, according to the reduced graph, a first color pattern of a plurality of color patterns to a first pattern, corresponding to the first vertex, and a second pattern, corresponding to the second vertex, in the layout; and
    after the operation of assigning, initiating fabrication of the circuit based on the layout, wherein at least one of the operations of sorting, merging, assigning, or initiating is performed by a processor;
    wherein the operation of sorting comprises:
        selecting third vertices of the plurality of vertices and the first vertex as the first clique, wherein the third vertices and the first vertex are connected with each other; and
        selecting the third vertices and the second vertex as the second clique, wherein the third vertices and the second vertex are connected with each other,
    wherein the third vertices have at least three common vertices.

2. The method of claim 1, further comprising:
    assigning, according to the reduced graph, the rest of the color patterns to the rest patterns, corresponding to the rest of the vertices, in the layout.

3. The method of claim 1, further comprising:
    detecting whether a conflict is presented in the reduced graph.

4. The method of claim 3 wherein detecting whether the conflict is presented in the reduced graph comprises:
    detecting whether the first vertex is connected to the second vertex in the reduced graph;
    wherein the first color pattern is assigned to the first pattern and the second pattern when the first vertex is not connected to the second vertex.

5. The method of claim 4, further comprising:
    reporting that the conflict is presented in the reduced graph when the first vertex is connected to the second vertex.

6. The method of claim 1, wherein a number of the color patterns is M, M is a positive integer greater than or equal to 4, and the sorting the vertices comprises:
    selecting M−1 third vertices of the vertices and the first vertex as the first clique, wherein the M−1 third vertices and the first vertex are connected with each other; and
    selecting the M−1 third vertices and the second vertex as the second clique, wherein the M−1 third vertices and the second vertex are connected with each other.

7. A system, comprising:
    a memory configured to store computer program codes; and
    a processor configured to execute the computer program codes in the memory to:
        obtain a first clique of vertices that includes a first vertex and third vertices;
        obtain a second clique of vertices that includes a second vertex and the third vertices
        select the third vertices from the first clique of vertices;
        select the same third vertices from the second clique of vertices;
        merge the first vertex in the first clique of vertices in a conflict graph with the second vertex in the second clique of vertices in the conflict graph, to generate a reduced graph,
        wherein the first vertex is independent of the second clique, the second vertex is independent of the first clique, and the conflict graph corresponds to a layout of a circuit; and
        assign a first color pattern of a plurality of color patterns to a first pattern, corresponding to the first vertex, and a second pattern, corresponding to the second vertex, in the layout according to the reduced graph, wherein a number of the plurality of color patterns is M, and M is an integer greater or equal to 4; and
        after the operation of assigning, initiate fabrication of the circuit based on the layout.

8. The system of claim 7, wherein the first vertex is a relative complement of the second clique in the first clique, and the second vertex is a relative complement of the first clique in the second clique.

9. The system of claim 7, wherein both of the first clique of vertices and the second clique of vertices further comprise:
    a plurality of third vertices,
    wherein the third vertices and the first vertex are connected to each other, and the third vertices and the second vertex are connected to each other.

10. The system of claim 9, wherein the number of the third vertices is M−1.

11. The system of claim 7, wherein the processor is further configured to execute the computer program codes in the memory to:
    assign the rest of the color patterns to other patterns, corresponding to the rest of vertices in the conflict graph, in the layout.

12. The system of claim 7, wherein the processor is further configured to execute the computer program codes in the memory to:
    detect whether a conflict is presented in the reduced graph.

13. The system of claim 12, wherein the processor is further configured to execute the computer program codes in the memory to:
  detect whether the first vertex is connected to the second vertex;
  wherein the processor assigns the first color pattern to the first pattern and the second pattern when the first vertex is not connected to the second vertex.

14. The system of claim 13, wherein the processor is further configured to execute the computer program codes in the memory to:
  report that the conflict is presented in the reduced graph when the first vertex is connected to the second vertex.

15. The system of claim 7, wherein the processor is further configured to execute the computer program codes in the memory to:
  generate the conflict graph according to data representing the layout of the circuit.

16. A non-transitory computer readable medium comprising computer executable instructions which, when executed by a processor, cause the processor for carrying out a method, the method comprising:
  determining whether a first clique and a second clique have common vertices that are connected with each other;
  when the first clique and the second clique have the common vertices, merging a first vertex of a plurality of vertices in a conflict graph with a second vertex of the plurality of vertices, to generate a reduced graph, wherein the conflict graph corresponds to a layout of a circuit, each of the common vertices and the first vertex are connected with each other, and each of the common vertices and the second vertex are connected with each other;
  assigning a first color pattern of a plurality of color patterns to a first pattern, corresponding to the first vertex, and a second pattern, corresponding to the second vertex, in the layout when the first vertex is not connected to the second vertex, wherein a number of the plurality of color patterns is M, and M is an integer greater or equal to 4; and
  after the operation of assigning, initiating fabrication of the circuit based on the layout.

17. The non-transitory computer readable medium of claim 16, wherein the method further comprises:
  assigning, according to the reduced graph, the rest of the color patterns to the rest patterns, corresponding to the rest of the vertices, in the layout.

18. The non-transitory computer readable medium of claim 17, wherein the method further comprises:
  detecting whether the first vertex is connected to the second vertex in the reduced graph;
  wherein the first color pattern is assigned to the first pattern and the second pattern when the first vertex is not connected to the second vertex.

19. The non-transitory computer readable medium of claim 18, wherein the method further comprises:
  reporting that the conflict is presented in the reduced graph when the first vertex is connected to the second vertex.

20. The non-transitory computer readable medium of claim 16, wherein the method further comprises:
  selecting M−1 third vertices of the plurality of vertices and the first vertex as the first clique, wherein the M−1 third vertices are selected as the common vertices; and
  selecting the M−1 third vertices of the plurality of vertices and the second vertex as the second clique.

* * * * *